(12) United States Patent
Maeda

(10) Patent No.: US 7,688,502 B2
(45) Date of Patent: Mar. 30, 2010

(54) THREE-TERMINAL OPTICAL SIGNAL AMPLIFYING DEVICE

(76) Inventor: Yoshinobu Maeda, 2220, Kawarada-cho, Yokkaichi-shi, Mie 510-0874 (JP)

( * ) Notice: Subject to any disclaimer, the term of this patent is extended or adjusted under 35 U.S.C. 154(b) by 296 days.

(21) Appl. No.: 11/632,718

(22) PCT Filed: Mar. 4, 2005

(86) PCT No.: PCT/JP2005/003780
§ 371 (c)(1), (2), (4) Date: Feb. 26, 2007

(87) PCT Pub. No.: WO2006/011262
PCT Pub. Date: Feb. 2, 2006

(65) Prior Publication Data
US 2007/0201127 A1    Aug. 30, 2007

(30) Foreign Application Priority Data
Jul. 30, 2004    (JP)    ............................ 2004-224726

(51) Int. Cl.
*H01S 5/00* (2006.01)
*G02F 1/015* (2006.01)
(52) U.S. Cl. .................. 359/344; 359/333; 359/244
(58) Field of Classification Search .............. 359/244, 359/333, 344
See application file for complete search history.

(56) References Cited

U.S. PATENT DOCUMENTS

| | | | | |
|---|---|---|---|---|
| 5,264,960 A | * | 11/1993 | Glance | 359/344 |
| 5,771,250 A | * | 6/1998 | Shigehara et al. | 372/6 |
| 6,005,708 A | * | 12/1999 | Leclerc et al. | 359/326 |
| 6,035,078 A | * | 3/2000 | Dagens et al. | 385/14 |
| 6,040,938 A | * | 3/2000 | Ducellier | 359/344 |
| 6,335,813 B1 | * | 1/2002 | Janz et al. | 398/197 |
| 6,577,435 B1 | * | 6/2003 | Bang et al. | 359/326 |

(Continued)

FOREIGN PATENT DOCUMENTS

JP   A 9-304801   11/1997

(Continued)

OTHER PUBLICATIONS

Y. Maeda et al., "All-Optical Triode Based on a Tandem Wavelength Converter Using Reflective Semiconductor Optical Amplifiers," IEEE Photonics Technology Letters, vol. 15, No. 2, Feb. 2003, pp. 257-259.

*Primary Examiner*—Eric Bolda
(74) *Attorney, Agent, or Firm*—Oliff & Berridge, PLC

(57) ABSTRACT

In the three-terminal optical signal amplifying device 10, a portion of the neighboring light $L_S$ at other wavelength than that of the first wavelength $\lambda_1$ that is selected from the output light from the element 14 by the optical add drop filter 16, and the control light $L_C$ at the second wavelength $\lambda_2$ input from the external are together input to the second semiconductor optical amplifying element 18. The output light including the output signal light $L_{OUT}$ at the second wavelength $\lambda_2$ and the neighboring light at the neighboring wavelength to the second wavelength $\lambda_2$ that is modulated and controlled by the control light $L_C$ in the cross gain modulation is output from the second semiconductor optical amplifying element 18. And the output signal light $L_{OUT}$ at the second wavelength $\lambda_2$ passes through the wavelength selecting filter 20.

4 Claims, 12 Drawing Sheets

U.S. PATENT DOCUMENTS

| | | |
|---|---|---|
| 6,950,233 B1 * | 9/2005 | DiJaili et al. ................ 359/344 |
| 2001/0021060 A1 * | 9/2001 | Kim ........................... 359/332 |
| 2002/0105706 A1 * | 8/2002 | Ueno ......................... 359/179 |
| 2002/0176152 A1 * | 11/2002 | Parolari et al. .............. 359/326 |
| 2003/0058500 A1 * | 3/2003 | Sugawara ................... 359/135 |
| 2003/0174393 A1 | 9/2003 | Maeda et al. |
| 2004/0001247 A1 * | 1/2004 | Nojima ....................... 359/326 |
| 2004/0036946 A1 * | 2/2004 | Webb et al. ................. 359/264 |
| 2004/0109690 A1 | 6/2004 | Maeda |

FOREIGN PATENT DOCUMENTS

| | | |
|---|---|---|
| JP | 09321372 A * | 12/1997 |
| WO | WO 02/061502 A1 | 8/2002 |
| WO | WO 02/086616 A1 | 10/2002 |

* cited by examiner

THREE-TERMINAL OPTICAL SIGNAL AMPLIFYING DEVICE

TECHNICAL FIELD

The present invention relates to a three-terminal optical signal amplifying device suitable for optoelectronics such as optical communication, optical image processing, optical computation, optical measurement and optical integrated circuits, which are capable of advanced information processing

BACKGROUND ART

Actually, in optical communication, an optical signal that has been transmitted at a high speed is once converted into an electrical signal, which is subjected to data processing in an electronic circuitry, and the processed data signal is then reconverted into an optical signal to be transmitted. This incapability to achieve direct control of an optical signal with another optical signal has limited the efficiency of optical signal processing.

In such as high-speed processing of bulk information and broad-band services that provide information such as dynamic image communication and picture image transmission or distribution, using fiber-optic communication capable of broad-band efficient and high-speed data transmission or transfer, there is expected technique for processing an optical signal by another optical signal. In electronics, for example, there have been required functional elements (signal amplifying elements) equivalent to transistors, that is, optical function devices capable of controlling an optical signal directly with another optical signal.

The present inventors has suggested an optical function element and an optical function device that are configured to output an amplified signal light by controlling an input light using a control light as disclosed in WO02/086616 A1, Patent Document 1. It discloses a three-terminal optical function element to output a processed signal light of a first wavelength after such as a switching processing by a control light, as follows. A first input light at the first wavelength and a bias light at a second wavelength having a predetermined intensity are input to a first semiconductor optical amplifying element. A light at a second wavelength selected from the output light from the first semiconductor optical amplifying element and another laser light (control light) at another wavelength, for example, the first wavelength, are coupled together and input into a second semiconductor optical amplifying element. A portion of the output light from the second semiconductor optical amplifying element is returned by positive feedback, and an output signal light at the first wavelength is selected from the other portion.

Patent Document 1: WO02/086616 A1

DISCLOSURE OF THE INVENTION

Subject to be Solved

The above-indicated optical function element conventionally used has disadvantages as follows. Requiring a laser source in order to generate the second input light (bias light) at the second wavelength having the predetermined intensity that is input into the first semiconductor optical amplifying element together with the input light, causes the difficulty in integrating of the integrated circuit and small-sizing of the device. Furthermore, requiring many laser sources upon using many three-terminal optical signal amplifying devices causes expensiveness and complexity in a system of optical circuitries. And a change in the intensity of the laser light due to such as a change in the temperature extensively affects an output because the bias light of the second input light is generated by a laser source. Further, a change in the wavelength of the laser light causes such a disadvantage as an extensive change in its characteristics due to a change of the output from the first wavelength selecting element.

The present invention was made in the light of the background art described above. It is an object of the present invention to provide a three-terminal optical signal amplifying device having a simple structure that functions without a second input light (bias light) at a second wavelength having a predetermined intensity which is input together with an input light into a first semiconductor optical amplifying element, accordingly, to provide the device having a stable characteristics that does not suffer from the influence of a change in the characteristics, such as a change in the temperature, due to the bias light from a laser source.

Means for Solving the Subject

To achieve the object described above, the present inventor has made extensive studies, and found out the following. (a) The wavelength selecting filter to select the signal light of the bias light from the output light of the first semiconductor optical amplifying element is conventionally determined to be for a narrow range band, for example, not larger than approximately 1 nm, as possible. In order to obtain the necessary intensity of the signal light of the bias light selected by the wavelength selecting filter, a laser source is required for generating a bias light having a predetermined intensity to be input to the first semiconductor optical amplifying element together with the input light. (b) The cross gain modulation can be obtained in the second semiconductor optical amplifying element without an input of a bias light of the predetermined intensity from the laser source to the first semiconductor optical amplifying element, if the intensity of the signal light of the bias light passed through the wavelength selecting filter exceeds the predetermined value. (c) The above-indicated bias light is input in order to generate the cross gain modulation in the second semiconductor optical amplifying element. And the bias light in the wavelength band of the neighboring light at the first wavelength is sufficient to be utilized. Extension in the selected wavelength band range by the wavelength selecting filter causes an increase in the intensity of the bias light, and the cross gain modulation of the optical signal in the second semiconductor optical amplifying element. The present invention was made on the basis of the finding described above.

That is, there is provided according to a first aspect of the invention a three-terminal optical signal amplifying device being characterized by comprising: (a) a first semiconductor optical amplifying element and a second semiconductor optical amplifying element, each of the semiconductor optical amplifying element being respectively provided with an active layer constituted by a p-n junction; (b) a first input means to input a first input light at a first wavelength to the first semiconductor optical amplifying element; (c) a first wavelength selecting element which selects the total or a portion of a predetermined width of a wavelength band of a neighboring light at other wavelength than the first wavelength, from a light which is output from the first semiconductor optical amplifying element; (d) a second input means to input a second input light at a second wavelength to the second semiconductor optical amplifying element, together with the total or the portion of the predetermined width of the wavelength band of the neighboring light at other wavelength than the first wavelength which is selected by the first wavelength selecting element; and (e) a second wavelength selecting element which selects a light at the second wavelength, from a light which is output from the second semiconductor optical amplifying element, (f) wherein the first input light at the first wavelength is an input light which is intensity-modulated; wherein the second input light at the second wavelength is a control light; and wherein an output light at the second wavelength is provided with a signal waveform which the first input light is intensity-modulated during the control light is input. Preferably, the output light from the second semiconductor optical amplifying element is provided with a wavelength in accordance with on/off or the intensity modulation of the above-indicated first input light at the first wavelength and/or second input light at the second wavelength in the three-terminal optical signal amplifying device according to the first aspect of the invention.

There is provided according to a second aspect of the invention a three-terminal optical signal amplifying device being characterized by comprising: (a) a first semiconductor optical amplifying element being provided with an active layer constituted by a p-n junction; (b) a first input means and a second input means to respectively input a first input light at a first wavelength and a second input light at a second wavelength to an end face side and another end face side of the first semiconductor optical amplifying element, respectively; (c) a third wavelength selecting element which is provided on the end face side of the first semiconductor optical amplifying element, which permits the first input light at the first wavelength which is input from the first input means to pass through, and which reflects a light at the second wavelength in a light which is input from the first semiconductor optical amplifying element, so that the light at the second wavelength is input to the first semiconductor optical amplifying element; and (d) a fourth wavelength selecting element which is provided on the another end face side of the first semiconductor optical amplifying element, which permits the second input light at the second wavelength which is input from the second input means to pass through, and which reflects a light at the first wavelength in a light which is input from the first semiconductor optical amplifying element, so that the light at the first wavelength is input to the first semiconductor optical amplifying element, (e) wherein the first input light at the first wavelength is an input light which is intensity-modulated; wherein the second input light at the second wavelength is a control light; and wherein an output light at the second wavelength is selected by the fourth wavelength selecting element and output, and is provided with a signal waveform which the first input light is intensity-modulated during the control light is input.

There is provided according to a third aspect of the invention the device defined in the first aspect of the invention, wherein the second wavelength of the second input light used, for example, as the control light is equal to the first wavelength.

There is provided according to a fourth aspect of the invention the device defined in any one of the first to third aspect of the invention, wherein a gain of the output light at the second wavelength with respect to the second input light (control light) at the second wavelength is not smaller than 2, preferably, not smaller than 10.

There is provided according to a fifth aspect of the invention the device defined in any one of the first, third and fourth aspect of the invention, wherein the first wavelength selecting element and/or the second wavelength selecting element is a wavelength selecting filter which selects a light of which a spectrum range extends over not less than 5 nm, preferably, over not less than 10 nm.

There is provided according to a sixth aspect of the invention the device defined in any one of the first to fifth aspect of the invention, wherein the first wavelength selecting element, the second wavelength selecting element, the third wavelength selecting element and/or the fourth wavelength selecting element is constituted by one of a grating filter and a multilayer filter, the grating filter being formed such that a portion of the grating filter is effected to have a periodical change in the refractive index, and the multilayer filter being formed so that a plurality of pairs of layers that have different refractive indices from each other are laminated in the multilayer filter.

There is provided according to a seventh aspect of the invention the device defined in the sixth aspect of the invention, wherein the grating filter is constituted by a graded period diffraction grating.

There is provided according to an eighth aspect of the invention the device defined in any one of the first to seventh aspect of the invention, wherein the active layer of the first wavelength selecting element and/or the second wavelength selecting element is constituted by a quantum well, a strained superlattice or a quantum dot.

There is provided according to a ninth aspect of the invention the device defined in any one of the first to eighth aspect of the invention, wherein the first wavelength selecting element and/or the second wavelength selecting element is provided on its one end face with a reflection means to reflect a light which has passed through the active layer, and an input light is input through another end face. Or an input light is input and an output light is extracted through another end face.

There is provided according to a tenth aspect of the invention the device defined in the ninth aspect of the invention, wherein the reflection means is a Bragg diffraction grating or a multilayer filter or mirror in which a plurality of pairs of layers that have different refractive indices from each other are laminated.

There is provided according to an eleventh aspect of the invention the device defined in any one of the first to tenth aspect of the invention, wherein the first input means and/or the second input means is constituted by an optical circulator, a directional coupled device, or an optical add drop filter.

There is provided according to a twelfth aspect of the invention the device defined in any one of the first to eleventh aspect of the invention, wherein the three-terminal optical signal amplifying device is provided in an optical computing element, a wavelength division multiplexing optical repeater, or an optical memory.

EFFECT OF THE INVENTION

There is provided according to a first aspect of the invention a three-terminal optical signal amplifying device being characterized by comprising: (a) a first semiconductor optical amplifying element and a second semiconductor optical amplifying element, each of the semiconductor optical amplifying element being respectively provided with an active layer constituted by a p-n junction; (b) a first input means to input a first input light at a first wavelength to the first semiconductor optical amplifying element; (c) a first wavelength selecting element which selects the total or a portion of a predetermined width of a wavelength band of a neighboring light at other wavelength than the first wavelength, from a light which is output from the first semiconductor optical amplifying element; (d) a second input means to input a second input light at a second wavelength to the second semiconductor optical amplifying element, together with the total or the portion of the predetermined width of the wavelength band of the neighboring light at other wavelength than the first wavelength which is selected by the first wavelength selecting element; and (e) a second wavelength selecting element which selects a light at the second wavelength, from a light which is output from the second semiconductor optical amplifying element. Accordingly, the selected light in a certain wavelength band of the neighboring light at other wavelength than the first wavelength which is selected from the output light from the first semiconductor optical amplifying element and input to the second semiconductor optical amplifying element, has a reversed intensity to that of the output signal light at the first wavelength, and furthermore, has a sufficient intensity even when a bias light does not provided from a laser source. Consequently, in the second semiconductor optical amplifying element, cross gain modulation is generated and sufficient optical signal amplification is obtained due to the second input light (control light) at the second wavelength. In the three-terminal optical signal amplifying device according to the first aspect of the invention, a little changes in the temperature is expected and consequently, steady, constant operations are expected because no input of the bias light (laser light) which is the second input light at the second wavelength into the first semiconductor optical amplifying element in a predetermined intensity is required. Further, in the three-terminal optical signal amplifying device according to the first aspect of the invention, the first input light at the first wavelength is an input light which is intensity-modulated, the second input light at the second wavelength is a control light, and an output light at the second wavelength is provided with a signal waveform which the first input light is intensity-modulated during the control light is input. Accordingly, the output light with a wavelength in accordance with on/off or the intensity modulation can be obtained.

There is provided according to a second aspect of the invention a three-terminal optical signal amplifying device being characterized by comprising: (a) a first semiconductor optical amplifying element being provided with an active layer constituted by a p-n junction; (b) a first input means and a second input means to respectively input a first input light at a first wavelength and a second input light at a second wavelength to an end face side and another end face side of the first semiconductor optical amplifying element, respectively; (c) a third wavelength selecting element which is provided on the end face side of the first semiconductor optical amplifying element, which permits the first input light at the first wavelength which is input from the first input means to pass through, and which reflects a light at the second wavelength in a light which is input from the first semiconductor optical amplifying element, so that the light at the second wavelength is input to the first semiconductor optical amplifying element; and (d) a fourth wavelength selecting element which is provided on the another end face side of the first semiconductor optical amplifying element, which permits the second input light at the second wavelength which is input from the second input means to pass through, and which reflects a light at the first wavelength in a light which is input from the first semiconductor optical amplifying element, so that the light at the first wavelength is input to the first semiconductor optical amplifying element, (e) wherein the first input light at the first wavelength is an input light which is intensity-modulated; wherein the second input light at the second wavelength is a control light; and wherein an output light at the second wavelength is selected by the fourth wavelength selecting element and output, and is provided with a signal waveform which the first input light is intensity-modulated during the control light is input. Accordingly, the phase of the output light is the inverse phase of the first input light, and the wavelength is converted from the first wavelength to the second wavelength. The cross gain modulation occurs in the first semiconductor optical amplifying element and the optical signal amplification is provided by the second input light (control light) at the second wavelength. Using only one amplifying element, that is, the first semiconductor optical amplifying element, causes simplicity in its structure and, consequently, facility of manufacturing. The first input light at the first wavelength is an input light modulated in intensity, and the control light (second input light) at the second wavelength is a control light changed in intensity. FIG. 17 shows the output light at the second wavelength that has a signal waveform which the first input light is intensity-modulated during the control light is input. Consequently, the three-terminal optical signal amplifying device according to the second aspect of the invention can output the output light which is modulated in intensity, in accordance with an input of the control light.

There is provided according to a third aspect of the invention the device defined in the first aspect of the invention, wherein the second wavelength of the second input light used, for example, as the control light is equal to the first wavelength. Consequently, input and output signals having the single wavelength causes the simple construction of the optical circuitry There is provided according to a fourth aspect of the invention the device defined in any one of the first to third aspect of the invention, wherein a gain of the output light at the second wavelength with respect to the second input light (control light) at the second wavelength is not smaller than 10. Accordingly, a sufficient gain is obtained.

There is provided according to a fifth aspect of the invention the device defined in any one of the first, third and fourth aspect of the invention, wherein the first wavelength selecting element and/or the second wavelength selecting element is a wavelength selecting filter which selects a light of which a spectrum range extends over not less than 5 nm. Consequently, the neighboring light having a sufficient signal intensity can be input to the second semiconductor optical amplifying element.

There is provided according to a sixth aspect of the invention the device defined in any one of the first to fifth aspect of the invention, wherein the first wavelength selecting element, the second wavelength selecting element, the third wavelength selecting element and/or the fourth wavelength selecting element is constituted by one of a grating filter and a multilayer filter, the grating filter being formed such that a portion of the grating filter is effected to have a periodical change in the refractive index, and the multilayer filter being formed so that a plurality of pairs of layers that have different refractive indices from each other are laminated in the multilayer filter. This causes facility for manufacturing and providing with an integrated device operating as a one-chip device.

There is provided according to a seventh aspect of the invention the device defined in the sixth aspect of the invention, wherein the grating filter is constituted by a graded period diffraction grating. This can provide with an available filter having a wide range in the spectrum There is provided according to an eighth aspect of the invention the device defined in any one of the first to seventh aspect of the invention, wherein the active layer of the first wavelength selecting element and/or the second wavelength selecting element is constituted by a quantum well, a strained superlattice or a quantum dot. This provides with an element which has a high response speed.

There is provided according to a ninth aspect of the invention the device defined in any one of the first to eighth aspect of the invention, wherein the first wavelength selecting element and/or the second wavelength selecting element is provided on its one end face with a reflection means to reflect a light which has passed through the active layer, and an input light is input through another end face. Or an input light is input and an output light is extracted through another end face. Consequently, the device can be manufactured as a small-sized one and high efficiency in signal conversion can be achieved.

There is provided according to a tenth aspect of the invention the device defined in the ninth aspect of the invention, wherein the reflection means is a Bragg diffraction grating or a multilayer filter or mirror in which a plurality of pairs of layers that have different refractive indices from each other are laminated. This reflection means can be facilitatively provided on an end face of the optical waveguide formed on a semiconductor chip by evaporation or vapor deposition or sputtering technique.

There is provided according to an eleventh aspect of the invention the device defined in any one of the first to tenth aspect of the invention, wherein the first input means and/or the second input means is constituted by an optical circulator, a directional coupled device, or an optical add drop filter. Consequently, the device can be manufactured as a further small-sized one.

There is provided according to a twelfth aspect of the invention the device defined in any one of the first to eleventh aspect of the invention, wherein the three-terminal optical signal amplifying device is provided in an optical computing element, a wavelength division multiplexing optical repeater, or an optical memory. Consequently, an optical computing element, a wavelength division multiplexing optical repeater and an optical memory which are high-speed operable by using only optical signals.

Figure 1:
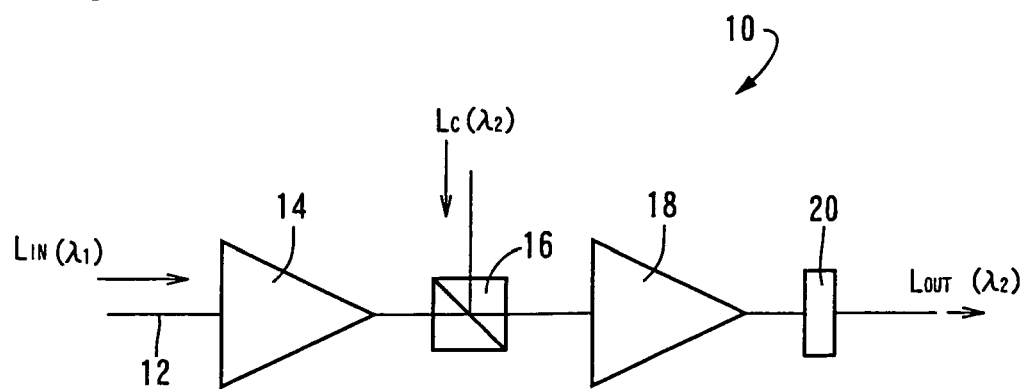
FIG. 1 illustrates a circuitry constitution of an embodiment of the three-terminal optical signal amplifying device according to the present invention in a block diagram.

REFERENCE NUMERALS 10, 24, 28, 32, 40, 42, 60: Three-terminal optical signal amplifying device
12: Optical fiber (First input means or portion)
14: First semiconductor optical amplifying element 16: Optical add drop filter (First wavelength selecting element, Second input means or portion)
18: Second semiconductor optical amplifying element
20, 38, 48: Wavelength selecting filter (Second wavelength selecting element)
36: Grating filter (First wavelength selecting element, Second input means or portion)
46: Wavelength selecting multilayer filter (First wavelength selecting element, Second input means or portion)
62: First wavelength selecting mirror (First wavelength selecting element)
64: Second wavelength selecting mirror (Second input means or portion)
70: Three-terminal optical signal amplifying device

BEST MODE FOR CARRYING OUT THE INVENTION

The semiconductor optical amplifying element is provided with the active layer constituted by the p-n junction to amplify the optical signal and is capable of generating the cross gain modulation. By the cross gain modulation an amplified laser light at the predetermined wavelength is output upon an input of a monochromatic laser light which is intensity-modulated, simultaneously, the neighboring light, that is, the spontaneous emission is output. The neighboring light has neighboring wavelengths around the wavelength of the input (or amplified) laser light, and the intensity of the neighboring light is increased or decreased in inverse proportion to the modulation of the input laser light in its intensity. Upon an input of a laser light having the predetermined intensity at the second wavelength which is within the range of the wavelengths of the spontaneous emission, the amplified laser light at the second wavelength is output which is modulated to be an inverse light with respect to the input light. In the conventional three-terminal optical signal amplifying device, the laser light of the predetermined intensity at the second wavelength is input to the first semiconductor optical amplifying element as a bias light.

The above-indicated neighboring light is a light appearing in the higher and lower ranges or neighboring range of the wavelength band about the first wavelength of the input signal light, and the neighboring light is modulated to have an inverse phase with respect to the output signal light at the first wavelength. Accordingly, the first wavelength selecting element which selects or separates the total of the neighboring light of the input light at the first wavelength from the output light from the first semiconductor optical amplifying element is available. And also the first wavelength selecting element which selects or separates a part of the neighboring light from the output light from the first semiconductor optical amplifying element and outputs to the second semiconductor optical amplifying element together with the control light is available. The wavelength band of the neighboring light from the first semiconductor optical amplifying element for outputting to the second semiconductor optical amplifying element is determined to generate sufficient cross gain modulation in the second semiconductor optical amplifying element. Although the intensity at the individual wavelength in the wavelength band of the neighboring light is low, high intensity of the light (or great magnitude in the intensity of the light) as the total can be achieved by selecting the wide range of the wavelength band.

On/off switching of the light input, or the input of the light having a predetermined intensity, or the signal light having a predetermined frequency or waveform for the control or modulation of the output light is available for the second input light at the second wavelength as the control light. Where the light having the predetermined intensity is adopted, the three-terminal optical signal amplifying device is used as, for example, a wavelength conversion device or a phase conversion device.

DETAILED DESCRIPTION OF EXEMPLARY EMBODIMENTS

Hereinafter, there will be described in detail a three-terminal optical signal amplifying device 10 according to one embodiment of the present invention by reference to the drawings.

Figure 2:
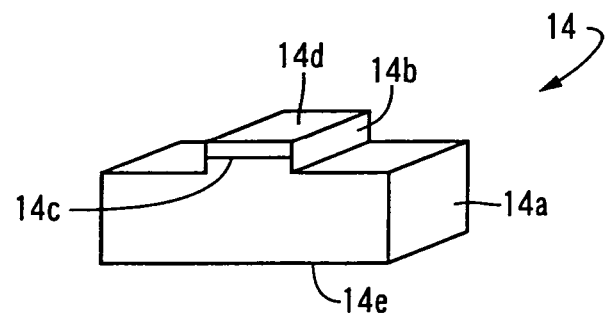
FIG. 2 illustrates a profile of an optical amplifying element where the optical amplifying element of the embodiment of the three-terminal optical signal amplifying device in FIG. 1 is constituted by a semiconductor optical amplifying element in a perspective view.

In a three-terminal optical signal amplifying device 10 in FIG. 1, an input signal light (first input light) $L_{IN}$ that has a first wavelength $\lambda_1$, for example, a narrow-band laser light having a center wavelength of 1550 nm is transmitted, through an optical fiber 12 functioning as a first input means or portion, to a first semiconductor optical amplifying (SOA) element 14. The input light to the element 14 is subject to cross gain modulation in the element 14. The first semiconductor optical amplifying element 14 is constituted, for example, by a semiconductor chip as shown in FIG. 2. In FIG. 2 an optical waveguide 14b formed on a semiconductor substrate 14a constituted by a compound semiconductor such as InP is a multilayer of a alloy semiconductor of Groups III-V grown on the semiconductor substrate 14a in an epitaxial growth method. It is formed, for example, by photolithography as a tape-shaped projection having a predetermined width. The optical waveguide 14b has a function of guiding a light, that is, transmitting a light with confining it within the waveguide 14b in the direction of width. This function is caused by that the waveguide 14b is constituted by a material whose refractive index is higher than that of the semiconductor substrate 14a. The multilayer in the above-indicated optical waveguide 14b includes such as an active layer 14c that is constituted by a p-n junction, and a cap layer. An upper electrode 14d is bonded to the upper surface of the optical waveguide 14b, and a bottom electrode 14e is bonded to the bottom surface of the semiconductor substrate 14a. In the active layer 14c, an electron-hole pair is generated by applying a voltage between the upper electrode 14d and the bottom electrode 14e and by an electric current through the above-indicated p-n junction. Accordingly, a light which passes through the active layer 14c is amplified by stimulated emission (of radiation), induced emission or induced radiation. The above-indicated active layer 14c is constituted by a multiple quantum well, a strained superlattice or a quantum dot. For example, the active layer 14c which has the multiple quantum well structure is constituted by six pairs of an InGaAs layer (100 Angstrom thick) and an InGaAsP layer (100 Angstrom thick) which are grown on the InP semiconductor substrate 14a in the epitaxial growth method and which are lattice-matched with each other. On this active layer 14c, there is formed a guide layer (2000 Angstrom) of a GRIN structure whose composition (refractive index) changes in steps. The active layer 14c has a device length (length of a light path) of 600 μm. This active layer 14c is considered to amplify a light passing therethrough, owing to generation of an optical energy from electrons excited by energy injection by application of an electric current of 250 mA, for example, when the electrons are moved to a valence band by stimulated emission by photons passing through the active layer 14c. The energy injection by application of the electric current of 250 mA provides a gain of about 20 dB as measured at the wavelength of 1555 nm.

Figure 3:
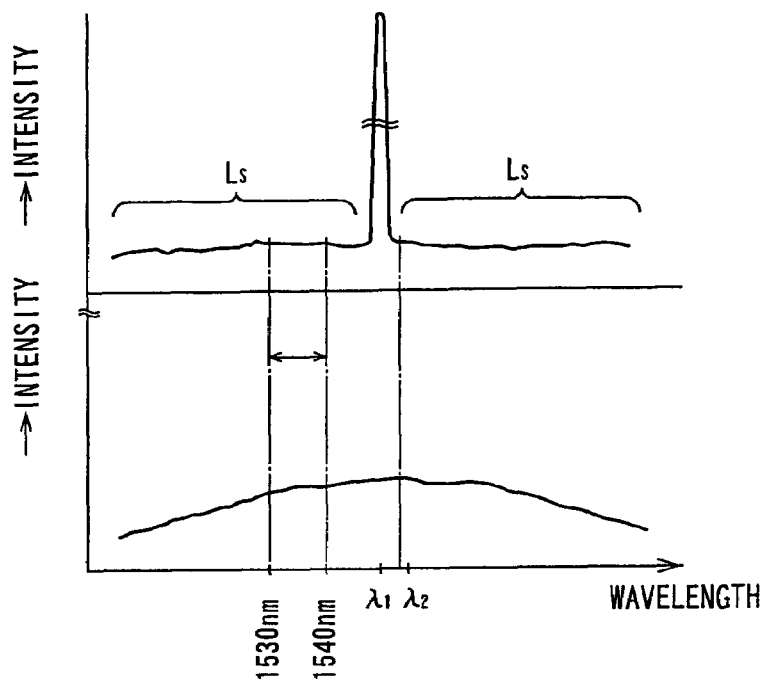
FIG. 3 illustrates output spectra from the first semiconductor optical amplifying element in the three-terminal optical signal amplifying device in FIG. 1, wherein the output spectrum in the on state of the signal light input is illustrated in the upper portion and the output spectrum in the off state of the signal light input is illustrated in the bottom portion.

The output light from the first semiconductor optical amplifying element 14 has spectra, for example, shown in FIG. 3. A spectrum in the upper portion of FIG. 3 shows a result of an experiment in which the input signal light $L_{IN}$ is input (the $L_{IN}$ input is in an on state) and a spectrum in the bottom portion of FIG. 3 shows a result of an experiment in which the input signal light $L_{IN}$ is not input (the $L_{IN}$ input is in an off state). As apparent in FIG. 3, the output light when the input signal light $L_{IN}$ is input includes an amplified light at the first wavelength $\lambda_1$ which the input signal light $L_{IN}$ is amplified, and a neighboring light $L_S$ at a neighboring wavelength $L_S$ that is different than the first wavelength $\lambda_1$. The intensity of the neighboring light $L_S$ in the on state of the $L_{IN}$ input is lower than that of the neighboring light $L_S$ in the off state of the $L_{IN}$ input. Such a phenomenon of inversion of the intensity is called "cross gain modulation", that is, the inversion between the intensity of the amplified light at the first wavelength $\lambda_1$ and the neighboring light $L_S$ at a neighboring wavelength $\lambda_S$ that is different than the first wavelength $\lambda_1$.

Figure 4:
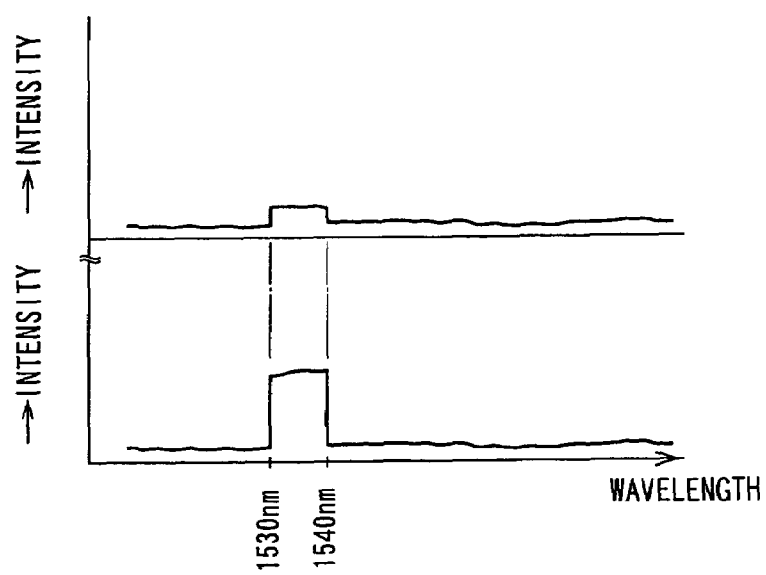
FIG. 4 illustrates output spectra from the three-terminal optical signal amplifying device in FIG. 1, wherein the optical spectrum of the neighboring light output from the optical add drop filter in the on state of the signal light input is illustrated in the upper portion and the optical spectrum of the neighboring light output from the optical add drop filter in the off state of the signal light input is illustrated in the bottom portion.

Referring again to FIG. 1, an optical add drop filter 16 functions as a first wavelength selecting element and a second input means or portion. The optical add drop filter 16 is a reflection multilayer filter utilizing optical interference and is constituted so that the filter 16 permits a light at the wavelength between 1530 nm and 1540 nm that has a wavelength band of 10 nm to be transmitted but the filter 16 reflects a light at other wavelengths than 1530 nm to 1540 nm. FIG. 4 shows spectra of the transmitted light through the optical add drop filter 16. In the upper portion is shown the spectrum in the on state of the input light $L_{IN}$ input and in the bottom portion is shown the spectrum in the off state of the input light $L_{IN}$ input. An appropriate wavelength band for the light transmission through the optical add drop filter 16 is selected so that the neighboring light $L_S$ to be transmitted to a second semiconductor optical amplifying element 18 has a sufficient intensity in order that a sufficient cross gain modulation is generated in the second semiconductor optical amplifying element 18. A wavelength band that has a range of more than or not less than 5 nm is sufficient for the cross gain modulation. Even the filter 16 that permits the whole neighboring light to be transmitted is sufficient. The optical add drop filter 16 selects a light at the wavelength between 1530 nm and 1540 nm, a portion of the wavelength of the neighboring light $L_S$, from the output light from the first semiconductor optical amplifying element 14 and inputs to the second semiconductor optical amplifying element 18. And the filter 16 reflects a control light (second input light) $L_C$ at a second wavelength $\lambda_2$ that is transmitted from an external, and inputs the light $L_C$ to the second semiconductor optical amplifying element 18. For the wavelength $\lambda_2$ of the control light $L_C$, any wavelength other than that of the neighboring light $L_S$ input to the second semiconductor optical amplifying element 18 may be acceptable. For example, a wavelength equal to the first wavelength $\lambda_1$ of the above-indicated input signal light $L_{IN}$ may be available. In this case, both the input signal light $L_{IN}$ and the output signal light $L_{OUT}$ have the same wavelength, that is, the first wavelength $\lambda_1$ in the three-terminal optical signal amplifying device 10, and it is an advantage.

The second semiconductor optical amplifying element 18 is constituted in the same manner as the first semiconductor optical amplifying element 14. From the element 18 an output light is output. The output light includes the output signal light $L_{OUT}$ at the second wavelength $\lambda_2$ and the neighboring light at the neighboring wavelength to the second wavelength $\lambda_2$ that are modulated and controlled by the control light $L_C$ in the cross gain modulation. A wavelength selecting filter 20 functions as a second wavelength selecting element that selects the same wavelength as the control light $L_C$ from the output light from the second semiconductor optical amplifying element 18. It is a multilayer filter that is constituted utilizing the optical interference so that the filter 20 permits a light at the second wavelength $\lambda_2$, for example, at the wavelength or in the wavelength band of 1550 nm to be transmitted but the filter 20 prevents (or reflects) the light at other than the second wavelength $\lambda_2$ from being transmitted therethrough. The above-indicated wavelength selecting filter 20 outputs an output light by passing through the output signal light $L_{OUT}$ at the second wavelength $\lambda_2$ that is modulated and controlled by the control light $L_C$ from the output light from the second semiconductor optical amplifying element 18.

In the three-terminal optical signal amplifying device 10 thus constituted, the input signal light $L_{IN}$ at the first wavelength $\lambda_1$ is input to the first semiconductor optical amplifying element 14, then, a portion of the neighboring light Ls at other wavelength than that of the first wavelength $\lambda_1$ that is selected from the output light from the element 14 by the optical add drop filter 16, and the control light (the second input light) $L_C$ at the second wavelength $\lambda_2$ input from the external are together input to the second semiconductor optical amplifying element 18. The output light including the output signal light $L_{OUT}$ at the second wavelength $\lambda_2$ and the neighboring light at the neighboring wavelength to the second wavelength $\lambda_2$ that is modulated and controlled by the control light $L_C$ in the cross gain modulation is output from the second semiconductor optical amplifying element 18. And the output signal light $L_{OUT}$ at the second wavelength $\lambda_2$ passes through the wavelength selecting filter 20 and is output. The selected light in a certain wavelength band of the neighboring light at other wavelength than the first wavelength $\lambda_1$ when it passes through the optical add drop filter 16 is inversed in its intensity with respect to the output signal light $L_{OUT}$ at the first wavelength $\lambda_1$, and furthermore, has a sufficient intensity even when a bias light does not provided from a laser source. Accordingly, in the second semiconductor optical amplifying element 18, sufficient optical signal amplification or mutual-cross gain modulation by the second input light (control light) at the second wavelength is provided.

Figure 5:
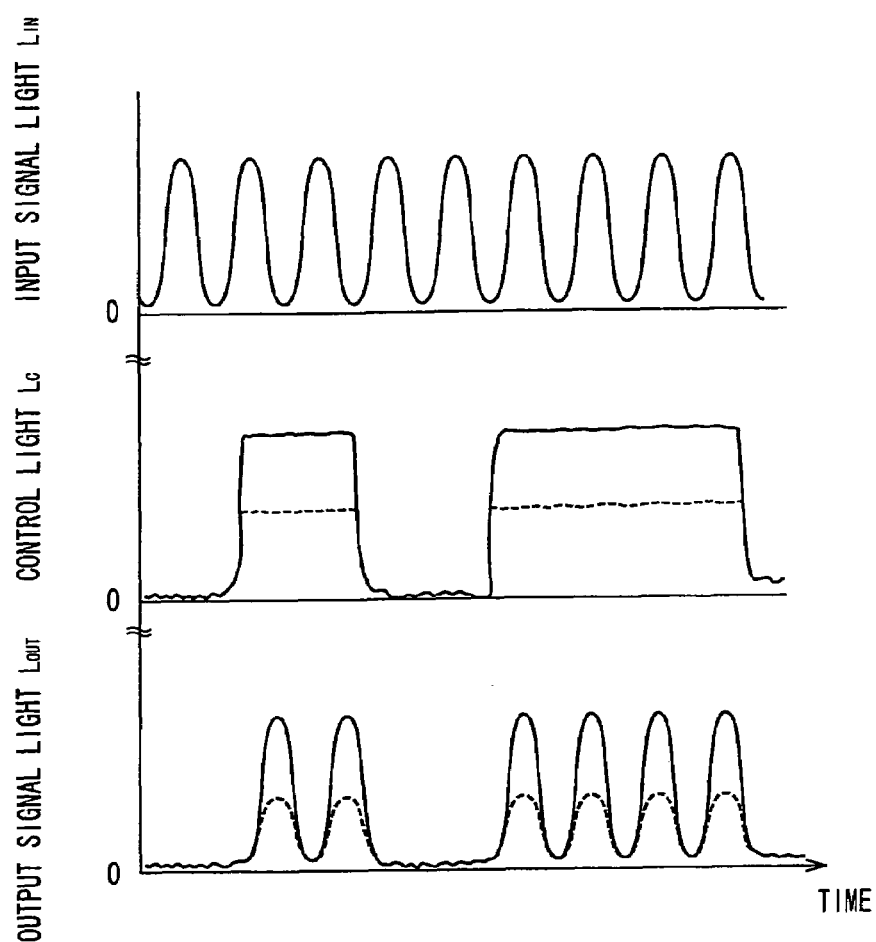
FIG. 5 illustrates input and output signal waveforms in the embodiment of the three-terminal optical signal amplifying device in FIG. 1 in a time diagram.
Figure 6:
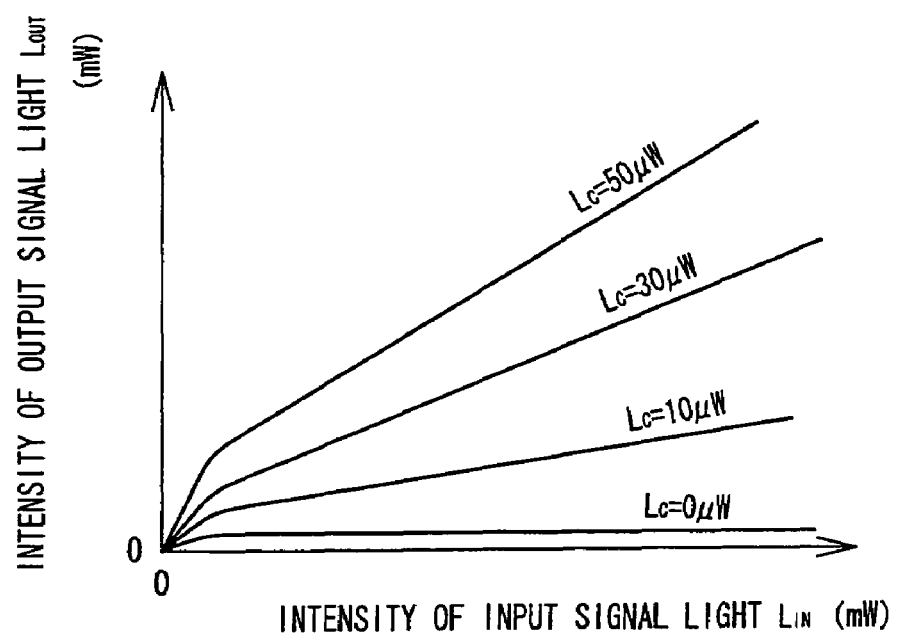
FIG. 6 illustrates input and output characteristics with a parameter of the intensity of the control light in the embodiment of the three-terminal optical signal amplifying device in FIG. 1 in a time diagram.

FIG. 5 shows spectra of the input signal light $L_{IN}$, the control light $L_C$ and the output signal light $L_{OUT}$ in the above-indicated three-terminal optical signal amplifying device 10. Each spectrum has the common scale on the axis of time. The output signal light $L_{OUT}$ in FIG. 5 corresponds to the amplified input signal light $L_{IN}$, has the same phase as $L_{IN}$, and modulated by on-off switching of the control light $L_C$. The device is configured to have such a characteristic that intensity (magnitude) of the output signal light $L_{OUT}$ is controlled in accordance with the intensity (magnitude) of the control light $L_C$. The decrease in the intensity of the control light $L_C$ plotted in a dashed line in FIG. 5 causes the decrease in the intensity of the output signal light $L_{OUT}$ also plotted in a dashed line, while the spectra of full intensity of the control light $L_C$ and the output signal light $L_{OUT}$ are plotted in solid lines. FIG. 6 shows characteristics in optical input and output with a parameter of the intensity of the control light $L_C$ in the three-terminal optical signal amplifying device 10. The noticeable important characteristic drawn from this graph is that it is possible to control an output light in several milliwatt (mW) by a control light in only several tens microwatt (μW). The signal amplification factor or gain of the output light with respect to the control light in this embodiment reaches approximately 10 to 30.

In the three-terminal optical signal amplifying device 10 in this embodiment, no changes in characteristics by effects of the bias light due to such as changes in temperature and steady, constant operations are expected because no input of the bias light (laser light) to the first semiconductor optical amplifying element 14 in a constant intensity is required.

Hereinafter, other embodiments of this invention will be described. In the following description, the same reference signs as used in the above embodiment will be used to identify the functionally corresponding elements, which will not be described redundantly.

Figure 7:
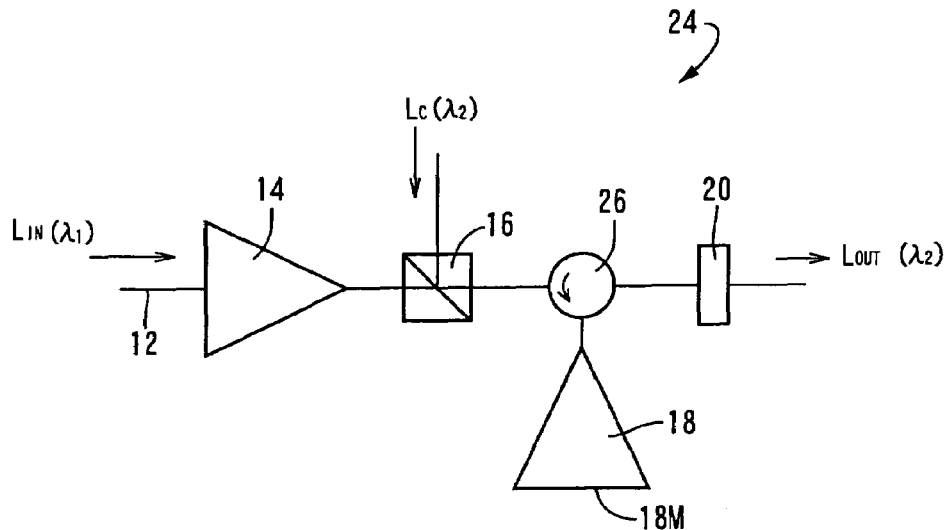
FIG. 7 illustrates a circuitry constitution of another embodiment of the three-terminal optical signal amplifying device according to the present invention in a block diagram which is illustrated in the same manner in FIG. 1.

In the three-terminal optical signal amplifying device 24 in FIG. 7, the second semiconductor optical amplifying element 18 is constituted by a reflection optical amplifying element. In the reflection optical amplifying element, an output light is reflected off a reflection end face 18M and output from the input side. This device 24 is an improvement of the three-terminal optical signal amplifying device 10 having such a different structure that an optical circulator 26 connects the optical add drop filter 16 to the wavelength selecting filter 20, and the second semiconductor optical amplifying element 18 is connected to (or combined with) the optical circulator 26. In the three-terminal optical signal amplifying device 24 in this embodiment, a portion of the neighboring light $L_S$ at other wavelength than the first wavelength $\lambda_1$ that is selected by the optical add drop filter 16, and the control light (the second input light) $L_C$ at the second wavelength $\lambda_2$ input from the external are together input through the optical circulator 26 to the second semiconductor optical amplifying element 18. The output light from the second semiconductor optical amplifying element 18 is transmitted through the circulator 26 to the wavelength selecting filter 20. Then the output signal light $L_{OUT}$ at the second wavelength $\lambda_2$ in the output light from the second semiconductor optical amplifying element 18 passes through the wavelength selecting filter 20 and output.

Figure 8:
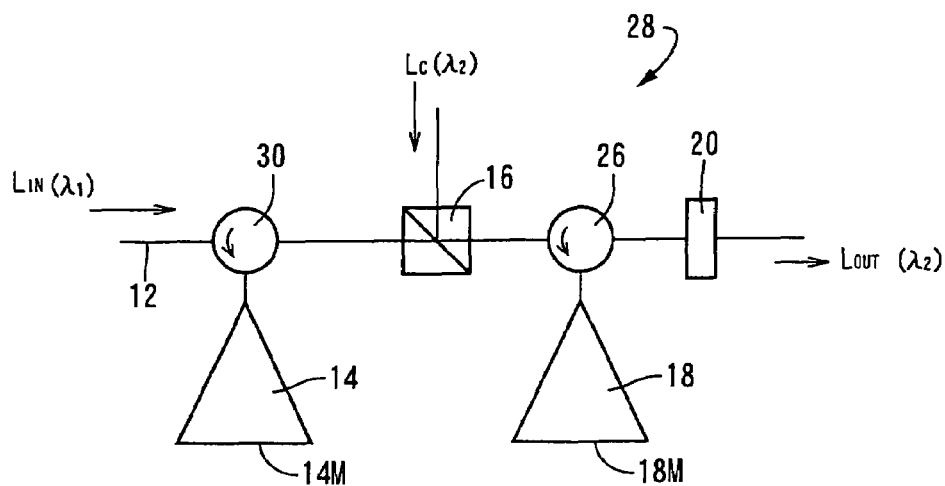
FIG. 8 illustrates a circuitry constitution of another embodiment of the three-terminal optical signal amplifying device according to the present invention in a block diagram which is illustrated in the same manner in FIG. 1.

In the three-terminal optical signal amplifying device 28 in FIG. 8, the first semiconductor optical amplifying element 14 is constituted by a reflection optical amplifying element. In the reflection optical amplifying element, an output light is reflected off a reflection end face 14M and output from the input side. This device 28 is an improvement of the three-terminal optical signal amplifying device 24 having such a different structure that an optical circulator 30 is connected to the optical add drop filter 16 at the input side of the filter 16, and the first semiconductor optical amplifying element 14 is connected to (or combined with) the optical circulator 30. In the three-terminal optical signal amplifying device 28 in this embodiment, the input signal light $L_{IN}$ at the first wavelength $\lambda_1$ is input through the optical circulator 30 to the first semiconductor optical amplifying element 14, and the output light from the first semiconductor optical amplifying element 14 is transmitted through the optical circulator 30 to the optical add drop filter 16. A portion of the neighboring light $L_S$ at other wavelength than the first wavelength $\lambda_1$ that is selected by the optical add drop filter 16, and the control light (the second input light) $L_C$ at the second wavelength $\lambda_2$ input from the external are together input to the second semiconductor optical amplifying element 18. Then the output signal light $L_{OUT}$ at the second wavelength $\lambda_2$ in the output light from the second semiconductor optical amplifying element 18 passes through the wavelength selecting filter 20 and output.

Figure 9:
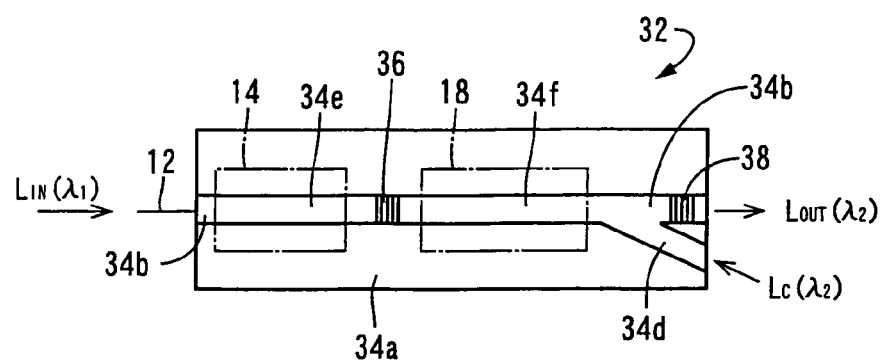
FIG. 9 illustrates an example of the monolithic one-chip semiconductor of the three-terminal optical signal amplifying device in FIG. 1 or 7.

In FIG. 9 is shown an embodiment of the three-terminal optical signal amplifying device 32 that is an integrated device formed on a semiconductor substrate 34a of one chip and operating as a one-chip device. In FIG. 9 an optical waveguide 34b formed on a semiconductor substrate 34a constituted by a compound semiconductor such as InP is a multilayer of a alloy semiconductor of Groups III-V grown on the semiconductor substrate 34a in an epitaxial growth method. It is formed, for example, by photolithography as a tape-shaped projection having a predetermined width. The optical waveguide 34b has a sufficient length to have the above-indicated first and second semiconductor optical amplifying element 14, 18 constituted on its substrate 34a, a branched waveguide 34d connected to the waveguide 34b at the end of the output side of the waveguide 34b so that the control light $L_C$ is input, and a function of guiding a light, that is, transmitting a light with confining it within the waveguide 34b in the direction of width. This function is caused by that the waveguide 34b is constituted by a material whose refractive index is higher than that of the semiconductor substrate 34a.

The multilayer in the above-indicated optical waveguide 34b includes such as an active layer constituted by a p-n junction having a structure of, for example, a multiple quantum well, a strained superlattice or a quantum dot, and a cap layer. A pair of electrodes, that is, first and second upper electrodes 34e, 34f are bonded to the upper surface of the optical waveguide 34b, and a bottom electrode (not shown) is bonded to the bottom surface of the semiconductor substrate 34a. In the active layer, an electron-hole pair is generated by applying a voltage between the pair of the upper electrodes, that is, the first and second upper electrodes 34e, 34f and the bottom electrode and by an electric current through the above-indicated p-n junction. Accordingly, a light which passes through the active layer 34c is amplified by stimulated emission (of radiation), induced emission or induced radiation. Between the pair of the upper electrodes, that is, the first and second upper electrodes 34e, 34f and the bottom electrode (not shown), are respectively constituted the first and second semiconductor optical amplifying element 14, 18.

Between the first and second upper electrodes 34e, 34f in the optical waveguide 34b there is provided with a grating filter 36 functioning as the first wavelength selecting element that permits a portion of the neighboring light $L_S$ in the output light from the first semiconductor optical amplifying element 14 to pass through due to a periodical change in the refractive index, and the second input means or portion. This grating filter 36 has a characteristic to prevent transmission of a light in, for example, a wavelength band of 1545 nm to 1560 nm and to permit transmission of a light in other wavelength band. There is provided with a wavelength selecting filter 38 in the optical waveguide 34b to permit transmission of a light substantially at the first wavelength $\lambda_1$, for example, in a wavelength band of 1550 nm between the junction of the optical waveguide 34b and the branched waveguide 34d, and the output side end face of the optical waveguide 34b. The wavelength selecting filter 38 may be bonded to the output side end face of the optical waveguide 34b, the filter 38 being constituted by a multilayer filter in which a number of (or a plurality of) pairs of layers that have different refractive indices from each other are laminated.

Figure 10:
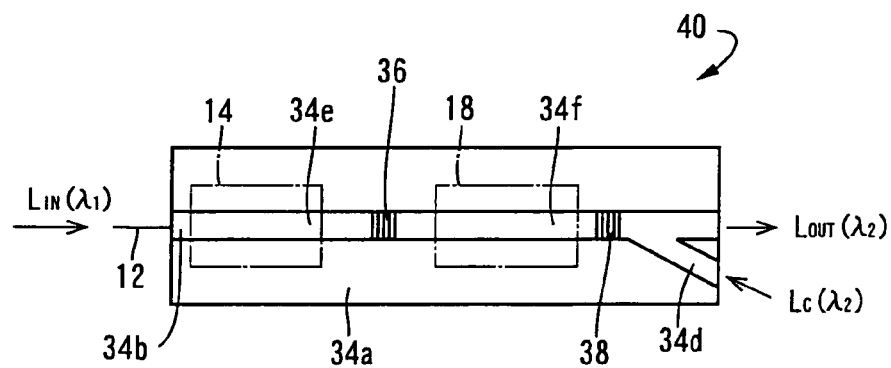
FIG. 10 illustrates another example of the monolithic one-chip semiconductor of the three-terminal optical signal amplifying device in FIG. 1 or 7.

In FIG. 10 is shown an embodiment of the three-terminal optical signal amplifying device 40 that is also an integrated device formed on a semiconductor substrate of one chip and operating as a one-chip device. This device 40 is an improvement of the three-terminal optical signal amplifying device 32 having such a different structure that the wavelength selecting filter 38 is provided between the junction of the optical waveguide 34b and the branched waveguide 34d, and the second upper electrode 34f, in other words, they have the same structure except that different structure. The three-terminal optical signal amplifying devices 32 and 40 can operate in the same manner as the devices 10, 24 and 28. In the device 32 the control light $L_C$ is not required to be the second wavelength $\lambda_2$ because the wavelength selecting filter 38 is provided between the junction of the optical waveguide 34b and the branched waveguide 34d and the output side end face of the optical waveguide 34b, while in the device 40 the control light $L_C$ is required to be the second wavelength $\lambda_2$ because the wavelength selecting filter 38 is provided between the junction of the optical waveguide 34b and the branched waveguide 34d and the second upper electrode 34f. In this embodiment, the filter 38 is formed in the same manner as the above-indicated grating filter 36 such that a portion of the optical waveguide 34b is effected to have a periodical change in the refractive index.

Figure 11:
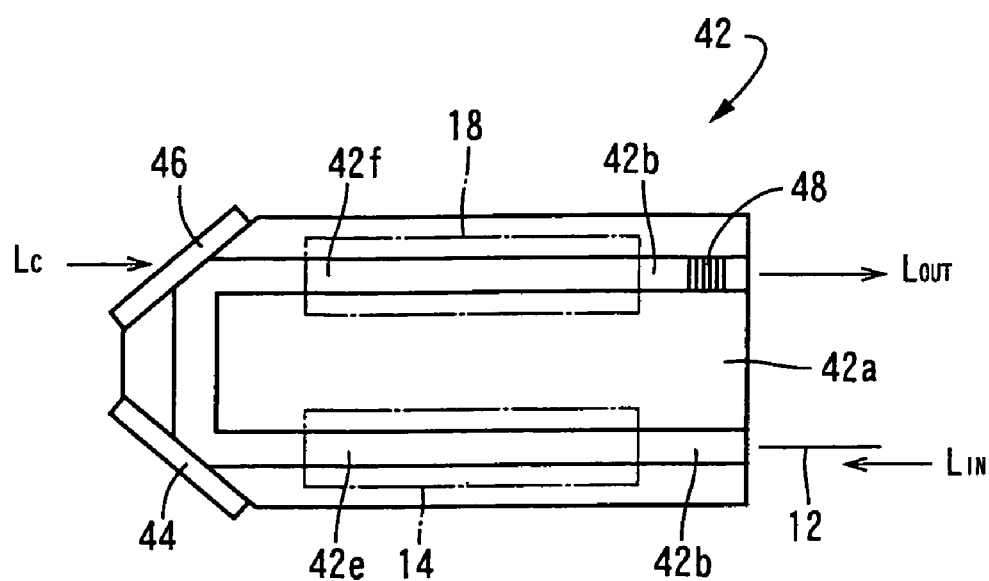
FIG. 11 illustrates another example of the monolithic one-chip semiconductor of the three-terminal optical signal amplifying device in FIG. 1.

In FIG. 11 is shown an embodiment of the three-terminal optical signal amplifying device 42 that is an integrated device formed on a semiconductor substrate of one chip and operating as a one-chip device. The device 42 is constituted by a semiconductor substrate 42a and an optical waveguide 42b formed on the substrate 42a. The semiconductor substrate 42a is constituted by a compound semiconductor such as InP, and has adjacent two 45-degree tapered corners in its four corners and a shape of a rectangle as seen from the side direction. The optical waveguide 42b is a multilayer of a alloy semiconductor of Groups III-V grown on the semiconductor substrate 42a in the epitaxial growth method. It is formed, for example, by photolithography as a tape-shaped projection having a predetermined width. The optical waveguide 42b has a function of guiding a light, that is, transmitting a light with confining it within the waveguide 42b in the direction of width. This function is caused by that the waveguide 42b is constituted by a material whose refractive index is higher than that of the semiconductor substrate 42a. The optical waveguide 42b is U-shaped and constituted by a pair of longitudinal (or parallel) portions extending parallel to each other and a connecting portion connecting the longitudinal portions at one ends. The lengths of the longitudinal portions are relatively longer than that of the connecting portion. The longitudinal portions have sufficient lengths to be provided with the first and second semiconductor optical amplifying elements 14, 18.

The multilayer in the above-indicated optical waveguide 42b includes such as an active layer constituted by a p-n junction having a structure of, for example, a multiple quantum well, a strained superlattice or a quantum dot, and a cap layer. A pair of electrodes, that is, first and second upper electrodes 42e, 42f are bonded to the upper surface of the pair of the longitudinal portions, and a bottom electrode (not shown) is bonded to the bottom surface of the semiconductor substrate 42a. In the active layer, an electron-hole pair is generated by applying a voltage between the pair of the upper electrodes, that is, the first and second upper electrodes 42e, 42f and the bottom electrode and by an electric current through the above-indicated p-n junction. Accordingly, a light which passes through the active layer is amplified by stimulated emission (of radiation), induced emission or induced radiation. Between the pair of the upper electrodes, that is, the first and second upper electrodes 42e, 42f and the bottom electrode (not shown), are respectively constituted the first and second semiconductor optical amplifying element 14, 18. And there are provided with a total reflection mirror 44 and a wavelength selecting multilayer filter 46 respectively bonded to the tapered corners. The total reflection mirror 44 has no wavelength selectability and is constituted by such as a Bragg diffraction grating, a multilayer mirror or filter in which a number of (or a plurality of) pairs of layers that have different refractive indices from each other are laminated. The wavelength selecting multilayer filter 46 reflects the neighboring light $L_S$ in a predetermined length band, for example, of 1525 to 1535 nm, a width of 10 nm, other than the first wavelength $\lambda_1$, for example, of 1550 nm, while the filter 46 permits the control light $L_C$ at the first wavelength $\lambda_1$ to pass through. The wavelength selecting multilayer filter 46 functions as the first wavelength selecting element and the second input means or portion as well as the above-indicated optical add drop filter 16 and the grating filter 36, and is constituted by a filter in which a number of (or a plurality of) pairs of layers that have different refractive indices from each other are laminated. There is provided with a wavelength selecting filter 48 between the second semiconductor optical amplifying element 18 and the output side end face of the longitudinal portion of the output side of the optical waveguide 42b, to permit transmission of a light substantially at the first wavelength $\lambda_1$, for example, in a wavelength band of 1545 nm to 1560 nm. In this embodiment, the wavelength selecting filter 48 is formed such that a portion of the optical waveguide 42b is effected to have a periodical change in the refractive index, while the filter 18 may be bonded to the output side end face of the optical waveguide 34b, the filter 48 being constituted by a multilayer filter in which a number of (or a plurality of) pairs of layers that have different refractive indices from each other are laminated, in the same manner as the above-indicated wavelength selecting filter 38.

In the three-terminal optical signal amplifying device 42 described above, the input signal light $L_{IN}$ at the first wavelength $\lambda_1$ are input to an end face of one of the longitudinal portions of the U-shaped optical waveguide 42b. Then, the output light including the neighboring light around the first wavelength $\lambda_1$ and the signal light at the first wavelength $\lambda_1$ which is amplified is output from the first semiconductor optical amplifying element 14, and the output light is reflected off the total reflection mirror 44 and input to the wavelength selecting multilayer filter 46. The filter 46 selectively reflects the neighboring light in the predetermined wavelength band, for example, of 1525 to 1535 nm other than the first wavelength $\lambda_1$ in the output light from the first semiconductor optical amplifying element 14. At the same time, the filter 46 permits the control light $L_C$ at the second wavelength $\lambda_2$ from the external to pass through. Consequently, the neighboring light in the predetermined wavelength band other than the first wavelength $\lambda_1$ and the control light $L_C$ at the second wavelength $\lambda_2$ are together input to the second semiconductor optical amplifying element 18. Then the neighboring light around the second wavelength $\lambda_2$ and the output signal light $L_{OUT}$ at the second wavelength $\lambda_2$ modulated in cross gain conversion by the control light $L_C$ in the element 18, in other words, effected by cross gain modulation due to the control light $L_C$ in the element 18, are output from the element 18. In the end, the output signal light $L_{OUT}$ at the second wavelength $\lambda_2$ is selectively output from wavelength selecting filter 48.

Figure 12:
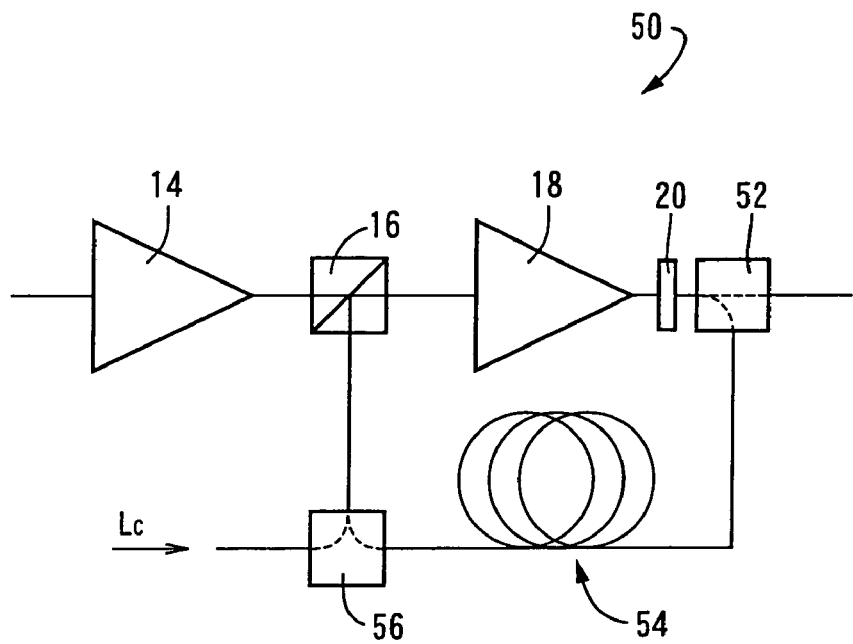
FIG. 12 illustrates an example of a circuitry constitution of an optical signal storage using the three-terminal optical signal amplifying device in FIG. 1.
Figure 13:
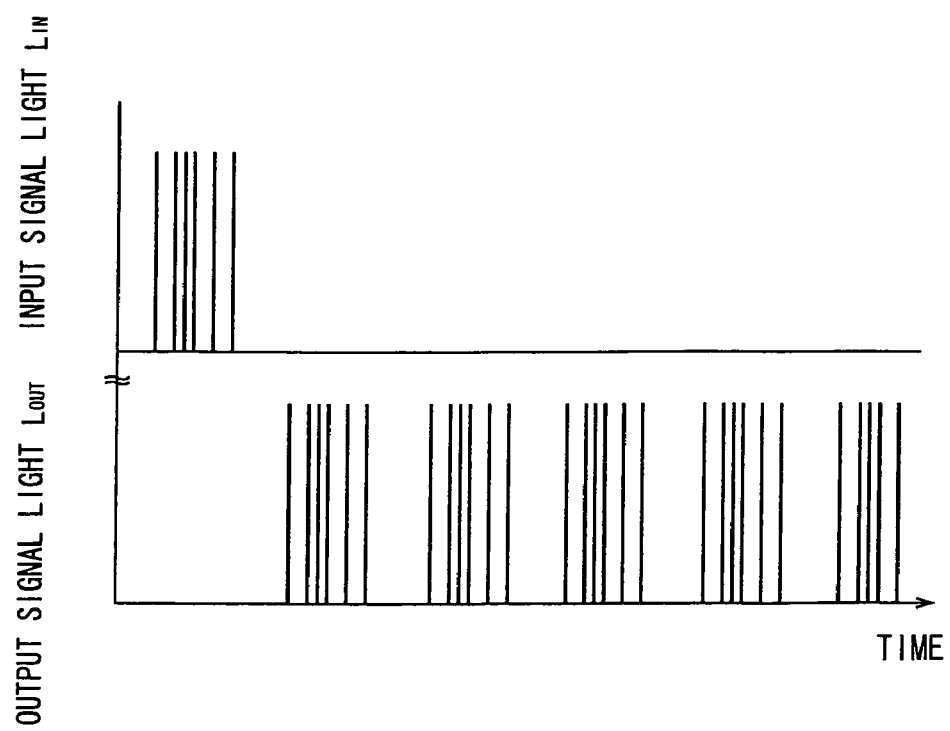
FIG. 13 illustrates input signal light and output signal light due to the input signal light which is stored in the storage in the optical signal storage in FIG. 12 in a time diagram.

In FIG. 12 is shown an application of the three-terminal optical signal amplifying device 10 in FIG. 1. It shows, in an example, a structure of an optical signal storage (or storage device or storing device) or an optical memory 50. The optical signal storage 50 corresponds to a structure substantially constituted by the three-terminal optical signal amplifying device 10 together with an optical coupler 52, an optical delay element 54 and an optical coupler 56. The optical coupler 52 divides a portion of the output signal light $L_{OUT}$ at the second wavelength $\lambda_2$ that is selectively output through the wavelength selecting filter 20 from the output light from the second semiconductor optical amplifying element 18. The optical delay element 54 delays transmission of the output signal light $L_{OUT}$ at the second wavelength $\lambda_2$ divided by the optical coupler 52. A rolled optical fiber of a predetermined length is an example of it. The optical coupler 56 couples the output signal light $L_{OUT}$ at the second wavelength $\lambda_2$ from the optical delay element 54 with the control light $L_C$, and outputs a signal light to the optical add drop filter 16. The optical signal storage 50 of this embodiment enables a periodical output of the output signal light $L_{OUT}$ from the optical coupler 52 by an input of the input signal light $L_{IN}$ as shown in FIG. 13. The upper portion of FIG. 13 shows the input signal light $L_{IN}$ and the bottom portion of it shows the periodical output signal light $L_{OUT}$. Consequently, the output signal light $L_{OUT}$ can be output at the desired time in the storage 50 and thus it functions as an optical signal storage.

Figure 14:
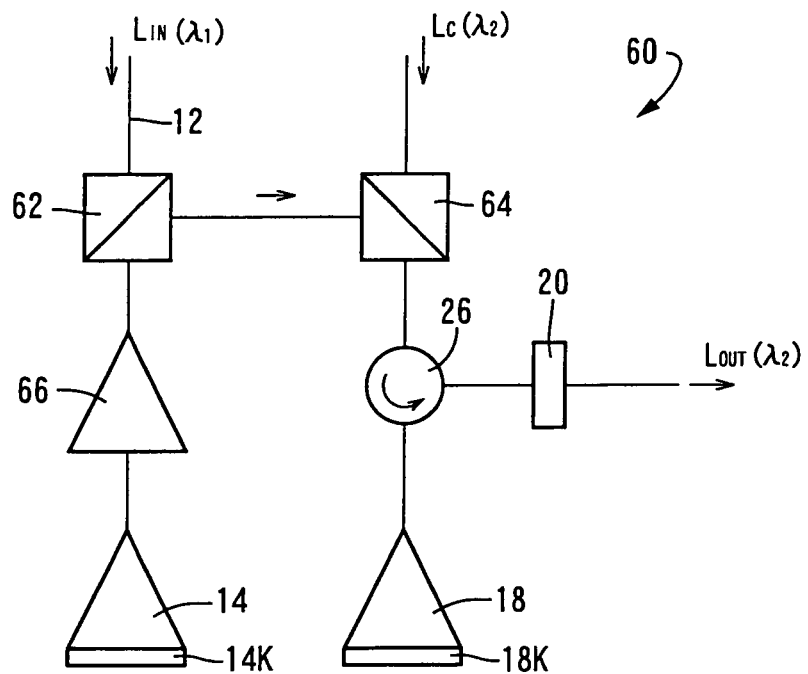
FIG. 14 illustrates a circuitry constitution of another embodiment of the three-terminal optical signal amplifying device according to the present invention in a block diagram which is illustrated in the same manner in FIG. 1.

In FIG. 14 is shown an embodiment of the three-terminal optical signal amplifying device 60. This device 60 is an improvement of the three-terminal optical signal amplifying device 28 in FIG. 8 having such a different structure that is provided with a first wavelength selecting mirror 62 functioning as the first wavelength selecting element, a second wavelength selecting mirror 64 functioning as the second input means or portion, and a third semiconductor optical amplifying element 66, instead of the optical add drop filter 16 and the optical circulator 30. The first wavelength selecting mirror 62 is a reflection multilayer filter utilizing optical interference, that is constituted by a structure that the mirror 62 reflects the neighboring light $L_S$ in a predetermined wavelength band, for example, of 1525 to 1535 nm, a width of 10 nm, other than the first wavelength $\lambda_1$, for example, of 1550 nm, while the mirror 62 permits a light at the first wavelength $\lambda_1$ to pass through. The second wavelength selecting mirror 64 is a reflection multilayer filter utilizing optical interference, that is constituted by a structure that the mirror 62 reflects the neighboring light $L_S$ in a predetermined wavelength band, for example, of at least 1525 to 1535 nm other than the second wavelength $\lambda_2$, for example, of 1555 nm, while the mirror 64 permits a light at the first wavelength $\lambda_1$ to pass through. The third semiconductor optical amplifying element 66 is constituted in the same manner as the first and second semiconductor optical amplifying elements 14, 18.

In the three-terminal optical signal amplifying device 60 described above, the input signal light $L_{IN}$ at the first wavelength $\lambda_1$ is input through the first wavelength selecting mirror 62 to the third semiconductor optical amplifying element 66 and to the reflective first semiconductor optical amplifying element 14 having a reflection mirror 14K at another end face. The neighboring light $L_S$ in the predetermined wavelength band of 1525 to 1535 nm is reflected off the first wavelength selecting mirror 62 and the second wavelength selecting mirror 64. The neighboring light $L_S$ is selected from a light that is reflected off the reflection mirror 14K and amplified in the third semiconductor optical amplifying element 66 and the first semiconductor optical amplifying element 14. Then, the light from the mirror 64 is transmitted through the optical circulator 26 to the reflective second semiconductor optical amplifying element 18 having a reflection mirror 18K at another end face. In the end, the output signal light $L_{OUT}$ at the second wavelength $\lambda_2$ in the output light from the element 18 passes through and output from wavelength selecting filter 20 functioning as the second wavelength selecting element. This embodiment confers the same advantages as the three-terminal optical signal amplifying device 28 in the above-indicated embodiment in FIG. 8 and, furthermore, confers additional advantages of providing with high gain and stability in amplification operation because the neighboring light $L_S$ is amplified in the third semiconductor optical amplifying element 66.

Figure 15:
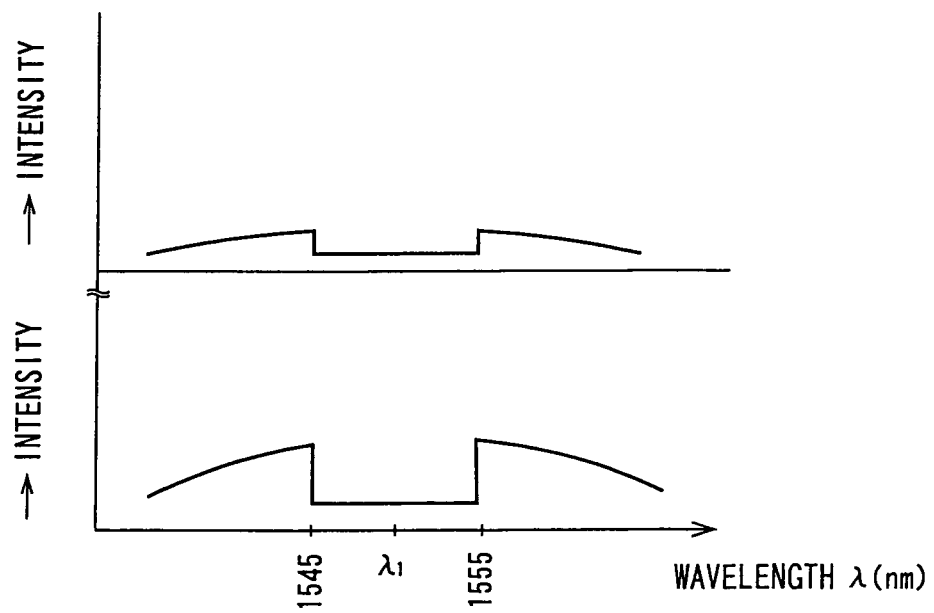
FIG. 15 illustrates another example of output spectra of the neighboring light input to the second semiconductor optical amplifying element in the three-terminal optical signal amplifying device in FIGS. 1 and 5-14, wherein the optical spectrum of the neighboring light input to the second semiconductor optical amplifying element in the on state of the signal light input is illustrated in the upper portion and the optical spectrum of the neighboring light in the off state of the signal light input is illustrated in the bottom portion.

In the three-terminal optical signal amplifying devices 10, 24, 32, 40, 42, 60 described above, the optical add drop filter 16, the grating filter 36, the wavelength selecting multilayer filter 46 and the first wavelength selecting mirror 62, for example, as shown in FIG. 4, select the neighboring light $L_S$ in a wavelength band on the short wavelength side that is a portion of the neighboring light $L_S$ and does not include the first wavelength $\lambda_1$, that is, 1550 nm, from the output light from the first semiconductor optical amplifying element 14, and output to the second semiconductor optical amplifying element 18. Instead, as shown in FIG. 15, such filters and mirrors may be available that select the neighboring light $L_S$ in a wide-range or the whole wavelength band that does not include a wavelength band of, for example, 1545 nm to 1555 nm around the first wavelength $\lambda_1$ in the center, from the output light from the element 14, and output to the element 18. This embodiment confers an additional advantage of providing with further stability because the intensity of the light signal that is input from the element 14 to the element 18 is increased. There is shown the intensity in the on state of the $L_{IN}$ input in the upper portion of FIG. 15, and that in the off state of the $L_{IN}$ input in the bottom portion.

Figure 16:
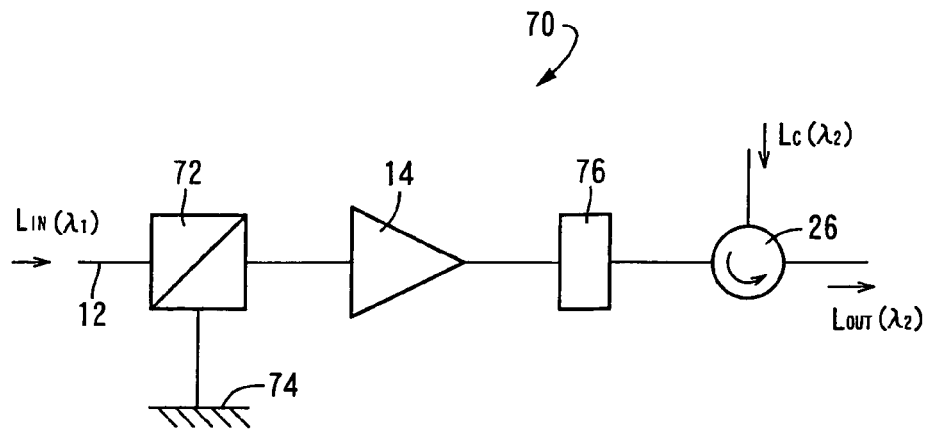
FIG. 16 illustrates a circuitry constitution of another embodiment of the three-terminal optical signal amplifying device which is provided with a single semiconductor optical amplifying element according to the present invention in a block diagram.

In FIG. 16 is shown an embodiment of the three-terminal optical signal amplifying device using a single semiconductor optical amplifying element, the first semiconductor optical amplifying element 14 in this embodiment. This device 70 includes the first semiconductor optical amplifying element 14, the optical fiber 12, a wavelength selecting mirror 72, a mirror 74, a wavelength selecting filter 76 and the circulator 26. The optical fiber 12 functioning as the first input means or portion which inputs the input light $L_{IN}$ at the first wavelength $\lambda_1$ from one end face side of the first semiconductor optical amplifying element 14. The wavelength selecting mirror 72 is provided between the optical fiber 12 and the element 14, and permits a light at the first wavelength $\lambda_1$ to pass through and reflects a light at the second wavelength $\lambda_2$. The mirror 74 reflects a light at the second wavelength $\lambda_2$ from the wavelength selecting mirror 72 to the mirror 72 through the same optical path as the input. The wavelength selecting filter 76 is provided on another end face side of the element 14, and reflects a light at the first wavelength $\lambda_1$ and permits a light at the second wavelength $\lambda_2$ to pass through. The circulator 26 is provided on the output side of the filter 76, transmits the control light (second input light) $L_C$ at the second wavelength $\lambda_2$ to the side of the filter 76, and outputs the output light $L_{OUT}$ at the second wavelength $\lambda_2$ input from the filter 76.

Figure 17:
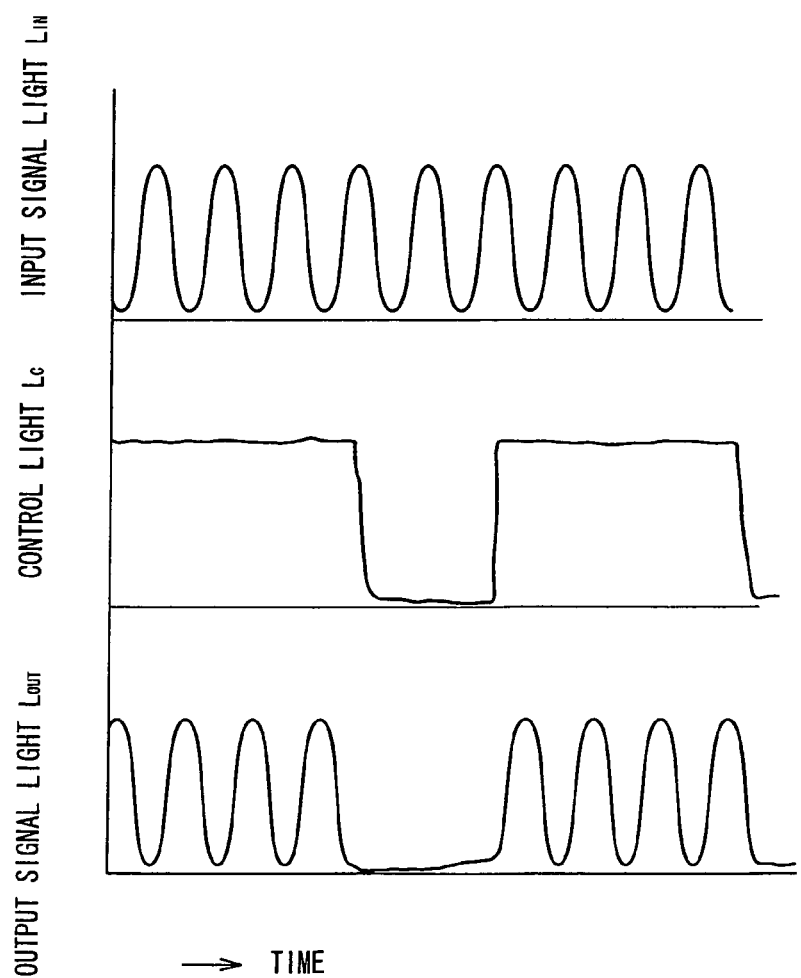
FIG. 17 illustrates signal waveforms in the optical signal control operation in the embodiment of the three-terminal optical signal amplifying device in FIG. 16 in a time diagram.

In this embodiment, the circulator 26 functions as the second input means or portion, and respectively inputs the second input light at the second wavelength $\lambda_2$ to element 14 on another end face side. A set of the wavelength selecting mirror 72 and the mirror 74 functions as the third wavelength selecting element, and reflects a light at the second wavelength $\lambda_2$ in a light from the first semiconductor optical amplifying element 14 to the element 14 while it permits the input light $L_{IN}$ at the first wavelength $\lambda_1$ to pass through. The wavelength selecting filter 76 functions as the fourth wavelength selecting element, and reflects a light at the first wavelength $\lambda_1$ in a light from the first semiconductor optical amplifying element 14 to the element 14 while it permits the control light $L_C$ at the second wavelength $\lambda_2$ from the circulator 26 to pass through. In this embodiment, as shown in FIG. 17, the phase of the output light $L_{OUT}$ is the inverse phase of the first input light $L_{IN}$, and the wavelength is converted from the first wavelength $\lambda_1$ to the second wavelength $\lambda_{2-}$. The cross gain modulation is generated in the first semiconductor optical amplifying element 14 and the optical signal amplification is provided by the second input light (control light) $L_C$ at the second wavelength $\lambda_2$. Using only one amplifying element, that is, the first semiconductor optical amplifying element 14, causes simplicity in its structure and, consequently, facility of manufacturing. The first input light $L_{IN}$ at the first wavelength $\lambda_1$ is an input light modulated in intensity, and the control light (second input light) $L_C$ at the second wavelength $\lambda_2$ is a control light changed in its intensity. FIG. 17 shows the output light $L_{OUT}$ at the second wavelength $\lambda_2$ that has a signal waveform which is intensity-modulated the first input light $L_{IN}$ during the control light $L_C$ is input. In this embodiment, consequently, the three-terminal optical signal amplifying device 70 can output the output light $L_{OUT}$ which is intensity-modulated, in accordance with an input of the control light $L_C$.

Figure 18:
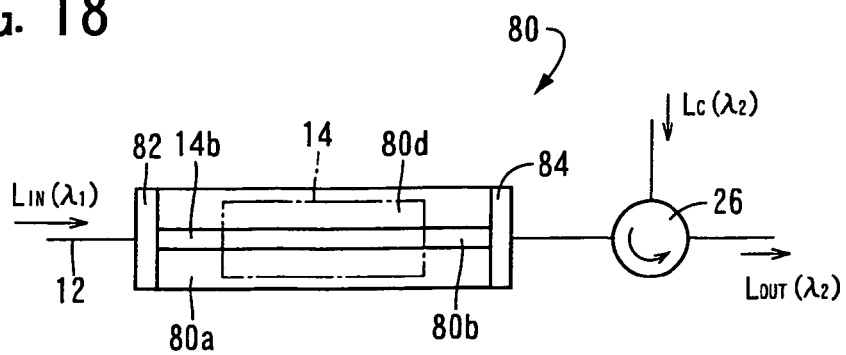
FIG. 18 illustrates another example of the constitution of the three-terminal optical signal amplifying device which is provided with a single semiconductor optical amplifying element.

In FIG. 18 is shown an embodiment of the three-terminal optical signal amplifying device 80 in which the first semiconductor optical amplifying element 14 is formed on a semiconductor substrate 80a of one chip and the device 80 operates as a one-chip device. It is a variation of the device 70 in FIG. 16 shown in a plane view. An optical waveguide 80b formed on the semiconductor substrate 80a constituted by a compound semiconductor such as InP is a multilayer of a alloy semiconductor of Groups III-V grown on the semiconductor substrate 80a in an epitaxial growth method. It is formed, for example, by photolithography as a tape-shaped projection having a predetermined width. As well as in the above-indicated embodiment, the multilayer in the optical waveguide 80b includes such as an active layer constituted by a p-n junction having a structure of, for example, a multiple quantum well, a strained superlattice or a quantum dot, and a cap layer. An electron-hole pair is generated by applying a voltage between an upper electrode 80d and a bottom electrode (not shown) and by an excitation electric current through the above-indicated p-n junction. Accordingly, a light which passes through the active layer is amplified by stimulated emission (of radiation), induced emission or induced radiation. Between the upper electrode 80d and the bottom electrode (not shown) there is provided with the first semiconductor optical amplifying element 14.

A first wavelength selecting multilayer filter 82 is provided on the input side end face of the semiconductor substrate 80a. The filter 82 reflects a light at the second wavelength $\lambda_2$ while it permits a light at the first wavelength $\lambda_1$ to pass through. A second wavelength selecting multilayer filter 84 is provided on the output side end face of the semiconductor substrate 80a. The filter 84 reflects a light at the first wavelength $\lambda_1$ while it permits a light at the second wavelength $\lambda_2$ to pass through. In this embodiment, the phase of the output light $L_{OUT}$ output through the second wavelength selecting multilayer filter 84 and the circulator 26 is the inverted phase of the first input light $L_{IN}$ input through the first wavelength selecting multilayer filter 82, and the wavelength is converted from the first wavelength $\lambda_1$ to the second wavelength $\lambda_2$ through the device 80. The same effect in the three-terminal optical signal amplifying device 70 in FIG. 16 is achieved in this embodiment by the cross gain modulation generated in the first semiconductor optical amplifying element 14 and the amplification of the light signal due to the second input light (control light) $L_C$ at the second wavelength $\lambda_2$. The first wavelength selecting multilayer filter 82 functions as the third wavelength selecting element which permits the first input light $L_{IN}$ at the first wavelength $\lambda_1$ from the optical fiber 12 to pass through, and reflects a light at the second wavelength $\lambda_2$ in a light from the element 14 and outputs to the element 14. The second wavelength selecting multilayer filter 84 functions as the fourth wavelength selecting element which permits the control light $L_C$ at the second wavelength $\lambda_2$ from the circulator 26 to pass through, and reflects a light at the first wavelength $\lambda_1$ in a light from the element 14 and outputs to the element 14.

Figure 19:
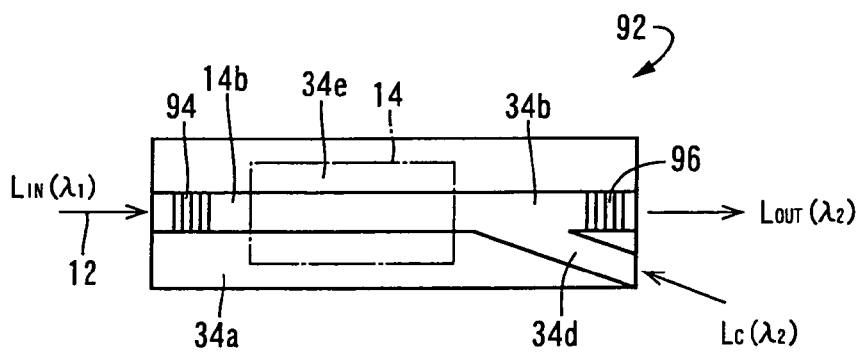
FIG. 19 illustrates another example of the constitution of the three-terminal optical signal amplifying device which is provided with a single semiconductor optical amplifying element.

In FIG. 19 is shown an embodiment of the three-terminal optical signal amplifying device 92. This device 92 is an improvement of the three-terminal optical signal amplifying device 32 in FIG. 9 having the same structure other than the structure in which the first semiconductor optical amplifying element 14 is removed away and the second semiconductor optical amplifying element 18 is replaced by the first semiconductor optical amplifying element 14. The optical waveguide 34b formed on the semiconductor substrate 34a constituted by a compound semiconductor such as InP is a multilayer of a alloy semiconductor of Groups III-V grown on the semiconductor substrate 34a in an epitaxial growth method. It is formed, for example, by photolithography as a tape-shaped projection having a predetermined width. The optical waveguide 34b has a sufficient length to have the above-indicated first semiconductor optical amplifying element 14 constituted on its substrate 34a, a branched waveguide 34d connected to the waveguide 34b at the end of the output side of the waveguide 34b so that the control light $L_C$ is input, and has a function of guiding a light, that is, transmitting a light with confining it within the waveguide 34b in the direction of width. This function is caused by that the waveguide 34b is constituted by a material whose refractive index is higher than that of the semiconductor substrate 34a. The multilayer in the optical waveguide 34b includes such as an active layer constituted by a p-n junction having a structure of, for example, a multiple quantum well, a strained superlattice or a quantum dot, and a cap layer. The upper electrode 34e is bonded to the upper surface of the optical waveguide 34b, and the bottom electrode (not shown) is bonded to the bottom surface of the semiconductor substrate 34a. In the active layer, the electron-hole pair is generated by applying a voltage between the upper electrode 34e and the bottom electrode (not shown) and by an electric current through the above-indicated p-n junction. Accordingly, a light which passes through the active layer is amplified by stimulated emission (of radiation), induced emission or induced radiation. Between the upper electrode 34e and the bottom electrode (not shown) there is provided with the first semiconductor optical amplifying element 14.

In the optical waveguide 34b there is provided with a first wavelength selecting filter 94 on the input side of the upper electrode 34e. The filter 94 permits a light at the first wavelength $\lambda_1$ to pass through and reflects a light at the second wavelength $\lambda_2$ due to a periodical change in the refractive index. Further, there is provided with a second wavelength selecting filter 96 in the optical waveguide 34b to reflect a light at the first wavelength $\lambda_1$ and to permit a light at the second wavelength $\lambda_2$ to pass through, between the junction of the optical waveguide 34b and the branched waveguide 34d, and the output side end face of the optical waveguide 34b. The first and second wavelength selecting filters 94, 96 are constituted, for example, by grating filters in which many or a plurality of regions having different refractive indices are latticedly arranged or arranged in a form of a reed screen. In this embodiment of the three-terminal optical signal amplifying device 92, the phase of the output light Lour output from the first semiconductor optical amplifying element 14 through the wavelength selecting filter 96 is the inverted phase of the first input light $L_{IN}$ input through the first wavelength selecting filter 94, and the wavelength is converted from the first wavelength $\lambda_1$ to the second wavelength $\lambda_2$ through the device 92. The same effects, such as, in the three-terminal optical signal amplifying device 80 is achieved also in this embodiment by the cross gain modulation generated in the first semiconductor optical amplifying element 14 and the amplification of the light signal due to the second input light (control light) $L_C$ at the second wavelength $\lambda_2$. Further, the circulator 26 is not required anymore for the device 92. In this embodiment, the wavelength selecting filter 94 functions as the third wavelength selecting element which permits the first input light $L_{IN}$ at the first wavelength $\lambda_1$ from the optical fiber 12 to pass through, and reflects a light at the second wavelength $\lambda_2$ in a light from the element 14 and outputs to the element 14. The wavelength selecting filter 96 functions as the fourth wavelength selecting element which permits the output light $L_{OUT}$ at the second wavelength $\lambda_2$ to pass through, and reflects a light at the first wavelength $\lambda_1$ in a light from the element 14 and outputs to the element 14.

Figure 20:
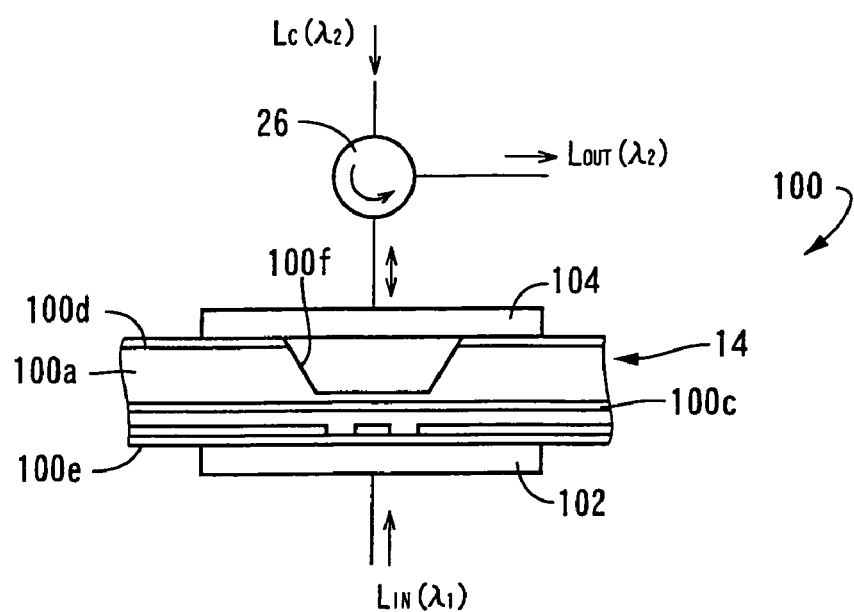
FIG. 20 illustrates another example of the constitution of the three-terminal optical signal amplifying device which is provided with a single semiconductor optical amplifying element.

In FIG. 20 is shown an embodiment of the three-terminal optical signal amplifying device 100. This device 100 has the first semiconductor optical amplifying element 14 in which a light is amplified in its depth direction of the semiconductor substrate. As well as an element of a surface emission semiconductor laser, the element 14 is provided with a multilayer of a alloy semiconductor of Groups III-V grown on a face (bottom face) of the semiconductor substrate 100a in an epitaxial growth method. The semiconductor substrate 100a is constituted by a compound semiconductor such as GaAs. The multilayer includes an active layer 100c constituted by a p-n junction, and others. In the active layer 100c, the electron-hole pair is generated by an excitation electric current between an upper electrode 100d bonded to another face (upper face) of the substrate and a bottom electrode 100e bonded on the side of the multilayer. Accordingly, a light which passes through the active layer is amplified by stimulated emission (of radiation), induced emission or induced radiation. The active layer 100c is constituted, for example, by a multiple quantum well, a strained superlattice or a quantum dot. The active layer 100c is considered to amplify a light passing therethrough, owing to generation of an optical energy from electrons excited by energy injection by application of an electric current when the electrons are moved to a valence band by stimulated emission by photons passing through the active layer 100c. A through-hole 100f is provided on the semiconductor substrate 100a for transmission of the amplified light.

A first wavelength selecting filter 102 is provided on the input side end face (bottom face) of the first semiconductor optical amplifying element 14. The filter 102 reflects a light at the second wavelength $\lambda_2$ while it permits a light at the first wavelength $\lambda_1$ to pass through. A second wavelength selecting filter 104 is provided on the output side end face (upper face) of the element 14. The filter 104 reflects a light at the first wavelength $\lambda_1$ while it permits a light at the second wavelength $\lambda_2$ to pass through. The first and second wavelength selecting filters 102, 104 are constituted by multilayers having transmission or reflection characteristics utilizing the above-indicated optical interference due to laminated dielectric layers. The circulator 26 is provided on the output side of the first semiconductor optical amplifying element 14. The control light $L_C$ at the second wavelength $\lambda_2$ is input through the circulator 26 and the second wavelength selecting filter 104 to the element 14, and then, the light is output from the element 14, transmitted through the filter 104 and the circulator 26, and the output light $L_{OUT}$ at the second wavelength $\lambda_2$ is output. In this embodiment of the three-tenninal optical signal amplifying device 100, the phase of the output light $L_{OUT}$ output from the first semiconductor optical amplifying element 14 and transmitted through the second wavelength selecting filter 104 and the circulator 26, is the inverted phase of the first input light $L_{IN}$ input to the first wavelength selecting filter 102 and transmitted to the element 14, and the wavelength is converted from the first wavelength $\lambda_1$ to the second wavelength $\lambda_2$ through the device 100. The same effects, such as, in the three-terminal optical signal amplifying device 80 is achieved also in this embodiment by the cross gain modulation generated in the first semiconductor optical amplifying element 14 and the amplification of the light signal due to the second input light (control light) $L_C$ at the second wavelength $\lambda_2$. Further, it causes remarkable small-sizing of the device. In this embodiment, the first wavelength selecting filter 102 functions as the third wavelength selecting element which permits the first input light $L_{IN}$ at the first wavelength $\lambda_1$ from the optical fiber 12 to pass through, and reflects a light at the second wavelength $\lambda_2$ in a light from the element 14 and outputs to the element 14. The second wavelength selecting filter 104 functions as the fourth wavelength selecting element which permits the control light $L_C$ at the second wavelength $\lambda_2$ to pass through, and reflects a light at the first wavelength $\lambda_1$ in a light from the element 14, to the element 14.

While the present invention has been described in its exemplary embodiment with reference to the drawings, it is to be understood that the present invention may be embodied otherwise.

For instance, such a filter that the changing period of the refractive index gradually increases or decreases in the direction of the light propagation, the so-called chirped grating filter, may be used for the above-indicated optical add drop filter 16, the wavelength selecting filter 20, the grating filter 36 and the wavelength selecting filters 38, 48 constituted by the filter in which the refractive index is periodically changed.

The above-indicated optical add drop filter 16 may be replaced by a unit including an optical coupler and a wavelength selecting filter which functions as well as the filter 16. It may be replaced by a unit including an optical circulator and a directional coupled device or element.

While, in the embodiments in FIGS. 7 and 8, the first and second semiconductor optical amplifying elements 14, 18 are constituted by reflection semiconductor optical amplifying elements in which the reflection end faces 14M, 18M are used for the reflection means or portion, a reflection semiconductor optical amplifying element in which a multilayer reflection mirror is bonded to the end face may be used for the reflection means or portion. The multilayer reflection mirror is constituted by the laminated layer of a number of (or a plurality of) pairs of layers. The pair of layers is constituted by layers having different refractive indices. The above-indicated multilayer reflection mirror may be replaced by a Bragg diffraction grating utilizing Bragg reflection.

While, in the first and second semiconductor optical amplifying elements 14, 18 of the above-indicated embodiment, an InGaAsP semiconductor is used for constituting such as a quantum well or a multiple quantum well in the active layer 14c of the multilayer in the optical waveguide 14b constituted by material having a higher refractive index than that of the semiconductor substrate 14a constituted by such as InP, other kind of a semiconductor matching with the operating wavelength may be used. For instance, a GaInNAs semiconductor is preferably used for the optical wavelength of the 1300 nm band. Since the GaInNAs semiconductor is provided with superior temperature characteristics, it is an advantage that no cooling means or portion to cool the semiconductor optical amplifying element is required.

While, in the above-indicated embodiments of FIGS. 9-11, each of the three-terminal optical signal amplifying devices 10, 32, 40 is constituted by an integrated device formed on a single semiconductor chip and operating as a one-chip device, a plurality of any of the three-terminal optical signal amplifying devices 10, 32, 40 may be provided on a single semiconductor chip which operates as a one-chip integrated device.

Since the three-terminal optical signal amplifying devices 10, 24, 28, 32, 40 in the above-indicated embodiments are capable of being used for an optical computing element (or optical computing unit or optical operator) and a wavelength division multiplexing optical repeater, the three-terminal optical signal amplifying device may constitute a portion of the optical computing element or the wavelength division multiplexing optical repeater.

It is to be understood that the present invention may be embodied with other changes, improvements, and modifications that may occur to a person skilled in the art without departing from the scope and spirit of the invention defined in the appended claims.

The invention claimed is:

1. A three-terminal optical signal amplifying device comprising:
    a first semiconductor optical amplifying element including an active layer constituted by a p-n junction;
    a first input means and a second input means to respectively input a first input light of a first wavelength and a second input light of a second wavelength to the first semiconductor optical amplifying element from an end face side and another end face side thereof, respectfully;
    a third wavelength selecting element provided on the end face side of the first semiconductor optical amplifying element, which permits the first input light of the first wavelength input from the first input means to pass therethrough, and which reflects a light of the second wavelength in a light from the first semiconductor optical amplifying element to the first semiconductor optical amplifying element; and
    a fourth wavelength selecting element provided on the another end face side of the first semiconductor optical amplifying element, which permits the second input light of the second wavelength input from the second input means to pass through, and which reflects a light of the first wavelength in a light from the first semiconductor optical amplifying element to the first semiconductor optical amplifying element,
    the first input light of the first wavelength being an input light which is intensity-modulated;
    the second input light of the second wavelength being a control light; and
    an output light of the second wavelength being selectively output by the fourth wavelength selecting element, and having a signal waveform which is obtained by intensity-modulating the first input light during an input of the control light.

2. The device according to claim 1, wherein the third wavelength selecting element and the fourth wavelength selecting element are constituted by one of a grating filter and a multilayer filter, the grating filter being formed such that a portion of the grating filter is effected to have a periodical change in the refractive index, and the multilayer filter being formed so that a plurality of pairs of layers that have different refractive indices from each other are laminated in the multilayer filter.

3. The device according to claim 1, wherein the active layer of the first wavelength selecting element is constituted by a quantum well, a strained superlattice or a quantum dot.

4. The device according to claim 1, wherein the second input means is constituted by an optical circulator.

* * * * *